(12) United States Patent
Chen

(10) Patent No.: US 6,929,995 B2
(45) Date of Patent: Aug. 16, 2005

(54) METHOD OF FORMING HIGH VOLTAGE METAL OXIDE SEMICONDUCTOR TRANSISTOR

(75) Inventor: Chin-Long Chen, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 61 days.

(21) Appl. No.: 10/707,217

(22) Filed: Nov. 27, 2003

(65) Prior Publication Data

US 2005/0118768 A1 Jun. 2, 2005

(51) Int. Cl.[7] .......................................... H01L 21/8238

(52) U.S. Cl. ...................... 438/229; 438/232; 438/300; 438/306

(58) Field of Search ................................ 438/229, 230, 438/231, 232, 299, 301, 302, 303, 304, 305, 438/306, 307, 527

(56) References Cited

U.S. PATENT DOCUMENTS

| | | | | |
|---|---|---|---|---|
| 5,516,717 A | * | 5/1996 | Hsu | 438/275 |
| 5,770,880 A | * | 6/1998 | Woodbury et al. | 257/336 |
| 5,920,774 A | * | 7/1999 | Wu | 438/224 |
| 6,277,694 B1 | * | 8/2001 | Wu | 438/266 |
| 6,297,108 B1 | * | 10/2001 | Chu | 438/297 |
| 6,333,234 B1 | * | 12/2001 | Liu | 438/307 |
| 6,392,274 B1 | * | 5/2002 | Tung | 257/339 |
| 6,835,624 B2 | * | 12/2004 | Pong et al. | 438/286 |

* cited by examiner

Primary Examiner—Kevin M. Picardat
(74) Attorney, Agent, or Firm—Winston Hsu

(57) ABSTRACT

A polysilicon layer and a first patterned photoresist layer are formed on a substrate. An ultraviolet curing process is performed to cure the first patterned photoresist layer. Then, a gate structure is formed by using the first patterned photoresist layer as a hard mask. A second patterned photoresist layer is formed on the substrate. The second patterned photoresist layer, the cured remaining first patterned photoresist layer and the gate form two openings alongside the gate structure. Finally, via the openings, two consecutive ion implantation processes are performed to form a double diffuse drain (DDD) structure.

14 Claims, 13 Drawing Sheets

METHOD OF FORMING HIGH VOLTAGE METAL OXIDE SEMICONDUCTOR TRANSISTOR

BACKGROUND OF INVENTION

1. Field of the Invention

The present invention relates to a method of forming a high voltage metal oxide semiconductor (HVMOS) transistor, and more particularly, to a method of forming a HVMOS transistor with a double diffuse drain (DDD).

2. Description of the Prior Art

Double diffuse drain (DDD) is a source/drain structure that is applied to HVMOS transistors. The DDD structure is able to provide the HVMOS transistor with a higher breakdown voltage. This can prevent a high voltage, such as electrostatic discharge (ESD), from damaging the transistor. Furthermore, the hot electron effect resulting from short channel is avoided.

Please refer to FIG. 1 showing a schematic diagram of a conventional HVMOS transistor 10 with DDD. As shown in FIG. 1, the HVMOS transistor 10 is formed in a substrate 12. The substrate 12 comprises two field oxide layers 14 formed in the substrate 12, a first conductive type well 16 formed in the substrate 12 between the field oxide layers 14, a gate 26 formed on the substrate 12 between the field oxide layers 14, and a gate oxide layer 24 between the gate 26 and the substrate 12. In addition, the substrate 12 comprises two second conductive type first doped regions 30 positioned in the substrate 12 between the gate 26 and the two field oxide layers 14, and two second conductive type second doped regions 32 positioned above the first doped regions 30.

Please refer to FIG. 2 to FIG. 5. FIG. 2 to FIG. 5 are schematic diagrams illustrating a method of forming the HVMOS transistor 10 according to the prior art. As shown in FIG. 2, first a substrate 12 is provided. Then, a thermal oxidation process is performed to form two field oxide layers 14 in the substrate 12, and a first conductive type well 16 is formed in the substrate 12. It is worth noting that if the desired HVMOS transistor 10 is N type, the first conductive type is P type, and if the desired HVMOS transistor 10 is P type, the first conductive type is N type.

As shown in FIG. 3, an oxide layer 18 and a polysilicon layer 20 are sequentially formed on the substrate 12, and a photoresist layer 22 is coated on the polysilicon layer 20. Then as shown in FIG. 4, an exposure process and a development process are performed to remove a portion of the photoresist layer 22 for forming a patterned photoresist layer (not shown). Then, an etching process is performed by utilizing the patterned photoresist layer (not shown) as a mask to remove the polysilicon layer 20 and the oxide layer 18 which are not covered by the mask such that a gate oxide layer 24 and a gate 26 are formed on the substrate 12. Finally, the patterned photoresist layer (not shown) is removed.

As shown in FIG. 5, another photoresist layer (not shown) is coated on the substrate 12, and an exposure process and a development process are sequentially performed to form a patterned photoresist layer 28 on the field oxide layers 14. Then, an ion implantation process is performed by utilizing the gate 26 and the patterned photoresist layer 28 as a hard mask to form two second conductive type first doped regions 30 in the substrate 12. Thereafter, another ion implantation process is performed to form two second conductive type second doped regions 32. It is worth noting that if the desired HVMOS transistor 10 is N type, the second conductive type is N type, and if the desired HVMOS transistor 10 is P type, the second conductive type is P type.

According to the prior art, the gate 26 and the patterned photoresist layer 28 above the two field oxide layers 14 are utilized as a hard mask, and two ion implantation processes are consecutively performed to form two first doped regions 30 and two second doped regions 32 which serve as the DDD of the HVMOS transistor 10. However, the thickness of the gate 26 hinders the doped energy during the ion implantation processes. Once the doped energy is too high, the doped ions will pass through the gate 26 and enter into the gate oxide layer 26 such that the gate 26 and the substrate 12 are short-circuited. Consequently, the first doped regions 30 and the second doped regions 32 cannot reach to an ideal depth according to the prior art due to the doped energy limitation. This makes the conventional HVMOS transistor 10 have a relatively poor breakdown voltage. Take a conventional N type HVMOS transistor for example. The breakdown voltage is about 20V, which does not meet the high voltage requirement (20V to 30V) for HVMOS transistors.

SUMMARY OF INVENTION

It is therefore a primary object of the claimed invention to provide a method of forming a HVMOS transistor for improving the breakdown voltage.

According to the claimed invention, a method of forming a HVMOS transistor with double diffuse drain (DDD) in a substrate is disclosed. The substrate comprises a first conductive type well. The method comprises forming a polysilicon layer and a first photoresist layer on the substrate, removing a portion of the first photoresist layer, performing an ultraviolet curing process to the first photoresist layer, removing a portion of the polysilicon layer not covered by the first photoresist layer to form a gate, coating a second photoresist layer onto the substrate and the first photoresist layer, removing a portion of the second photoresist layer to form two openings, performing two ion implantation processes consecutively to form two second conductive type first doped regions and two second conductive type second doped regions via the two openings, and removing the first photoresist layer and the second photoresist layer.

It is an advantage of the claimed invention that the photoresist layer originally used to form the gate is used as a hard mask to perform two ion implantation processes such that the doped regions are deeper than the doped regions of the prior art. Hence, the breakdown voltage is effectively improved.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
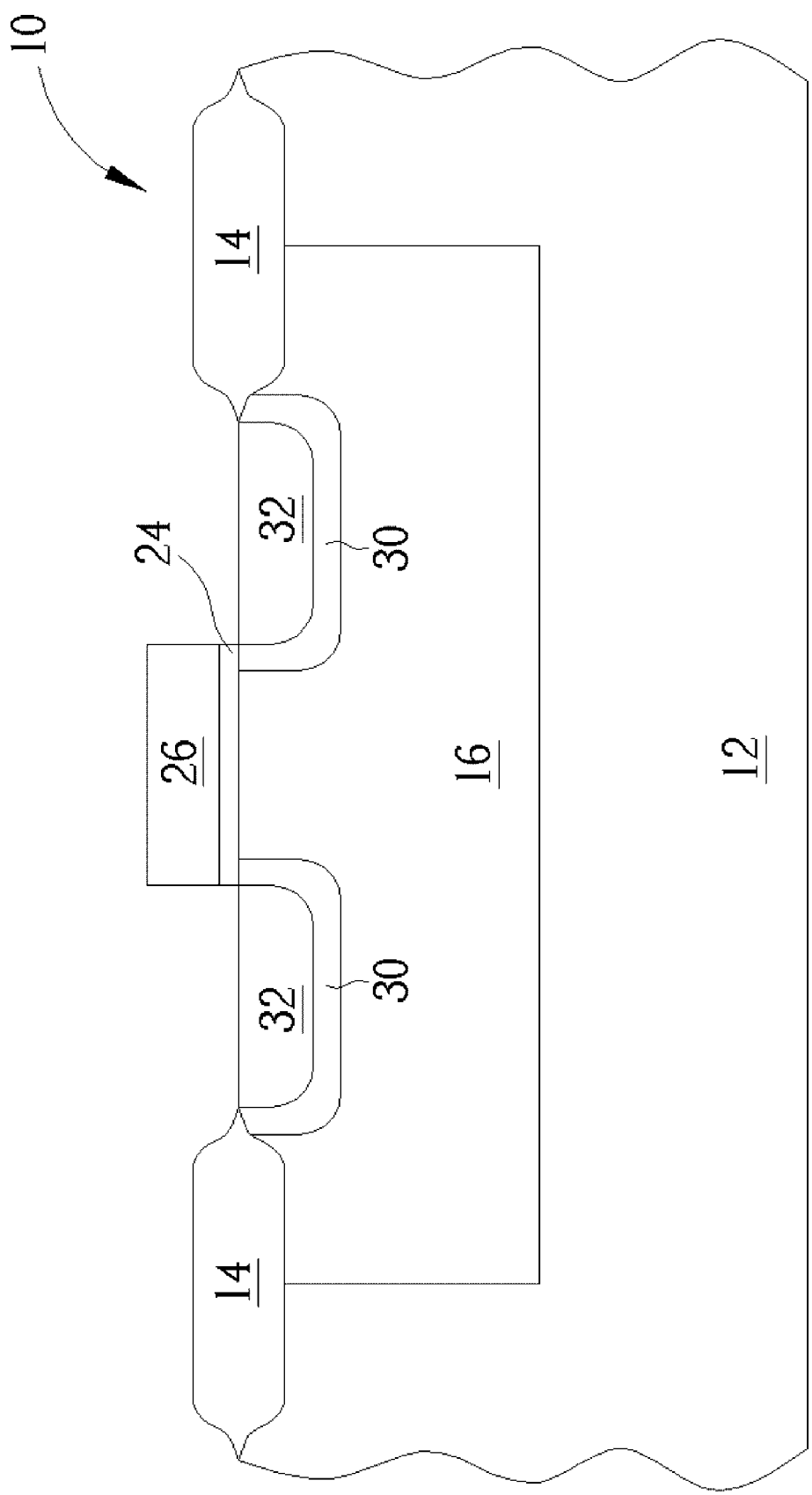
FIG. 1 is a schematic diagram of a conventional HVMOS transistor.
Figure 2:
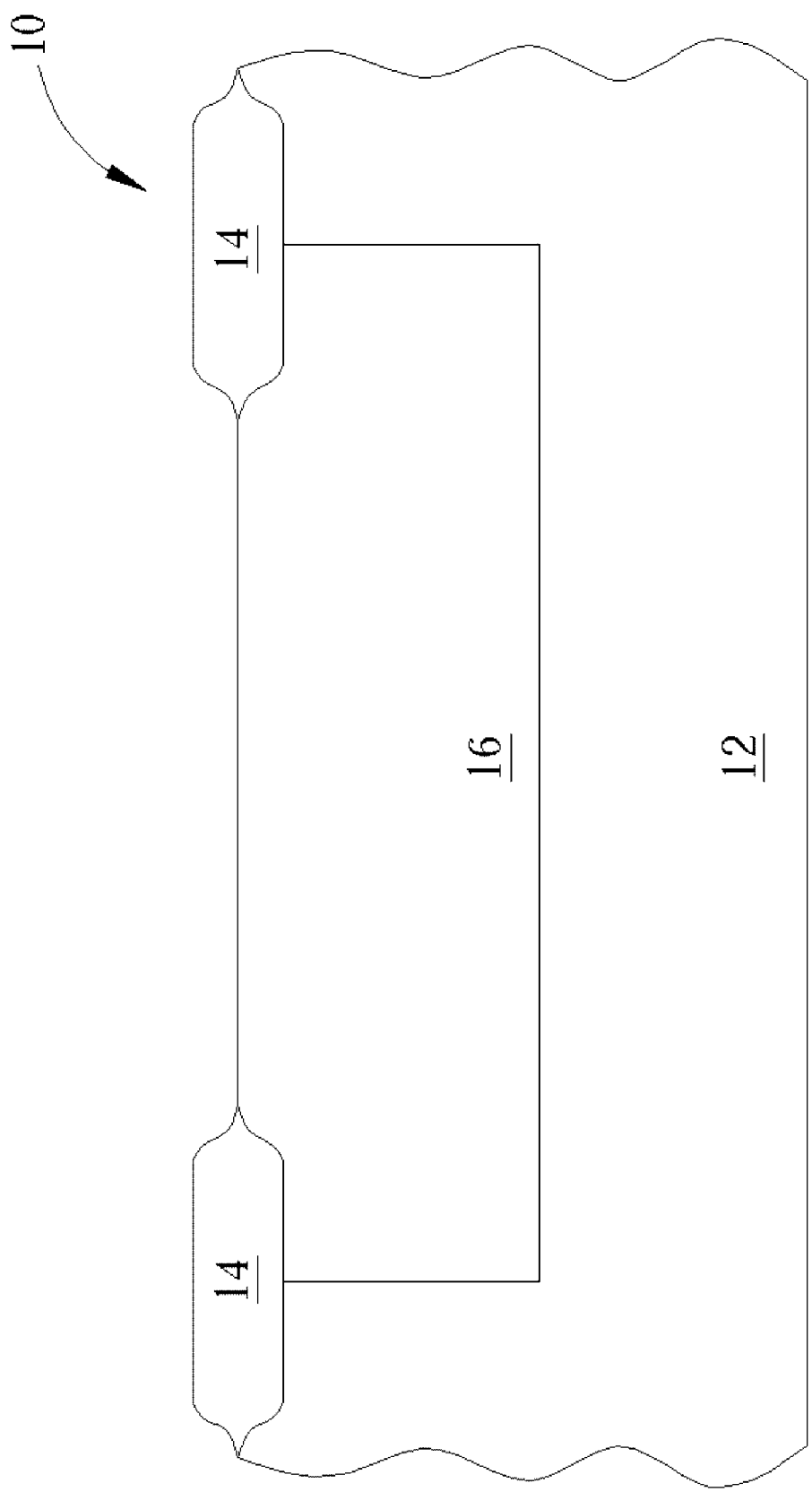
FIG. 2 to FIG. 5 are schematic diagrams illustrating a method of forming a HVMOS transistor according to the prior art.
Figure 3:
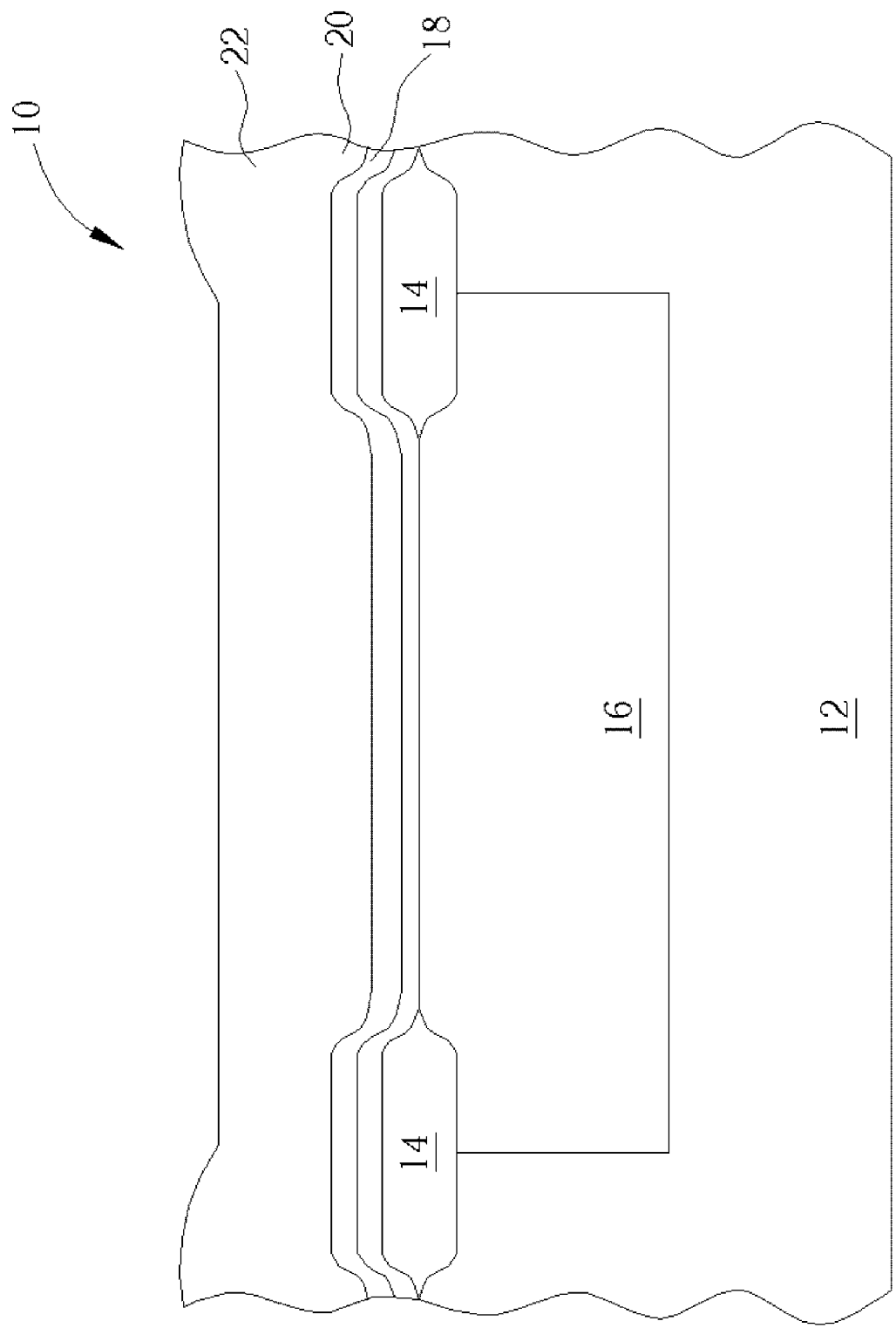
Figure 4:
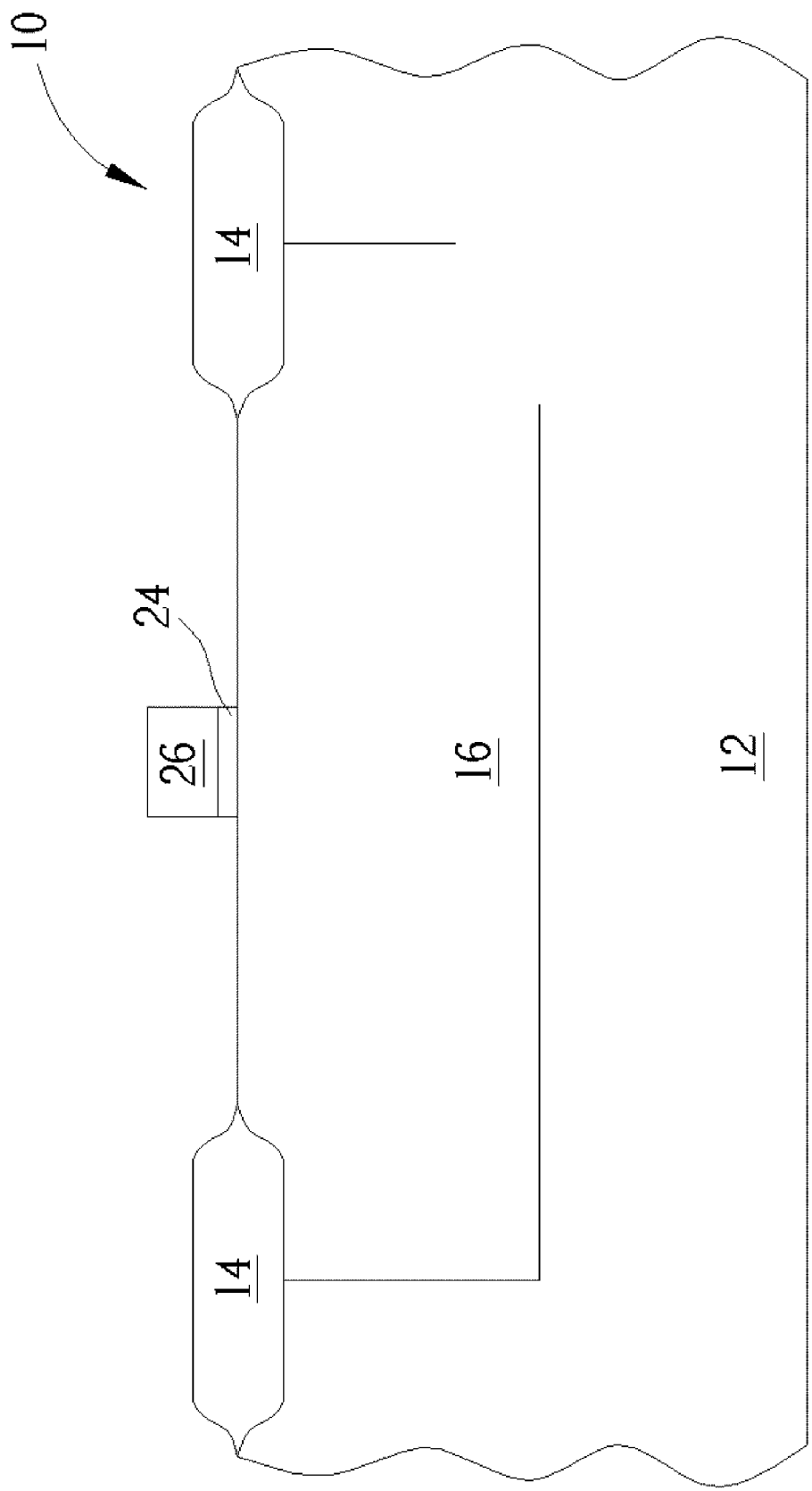
Figure 5:
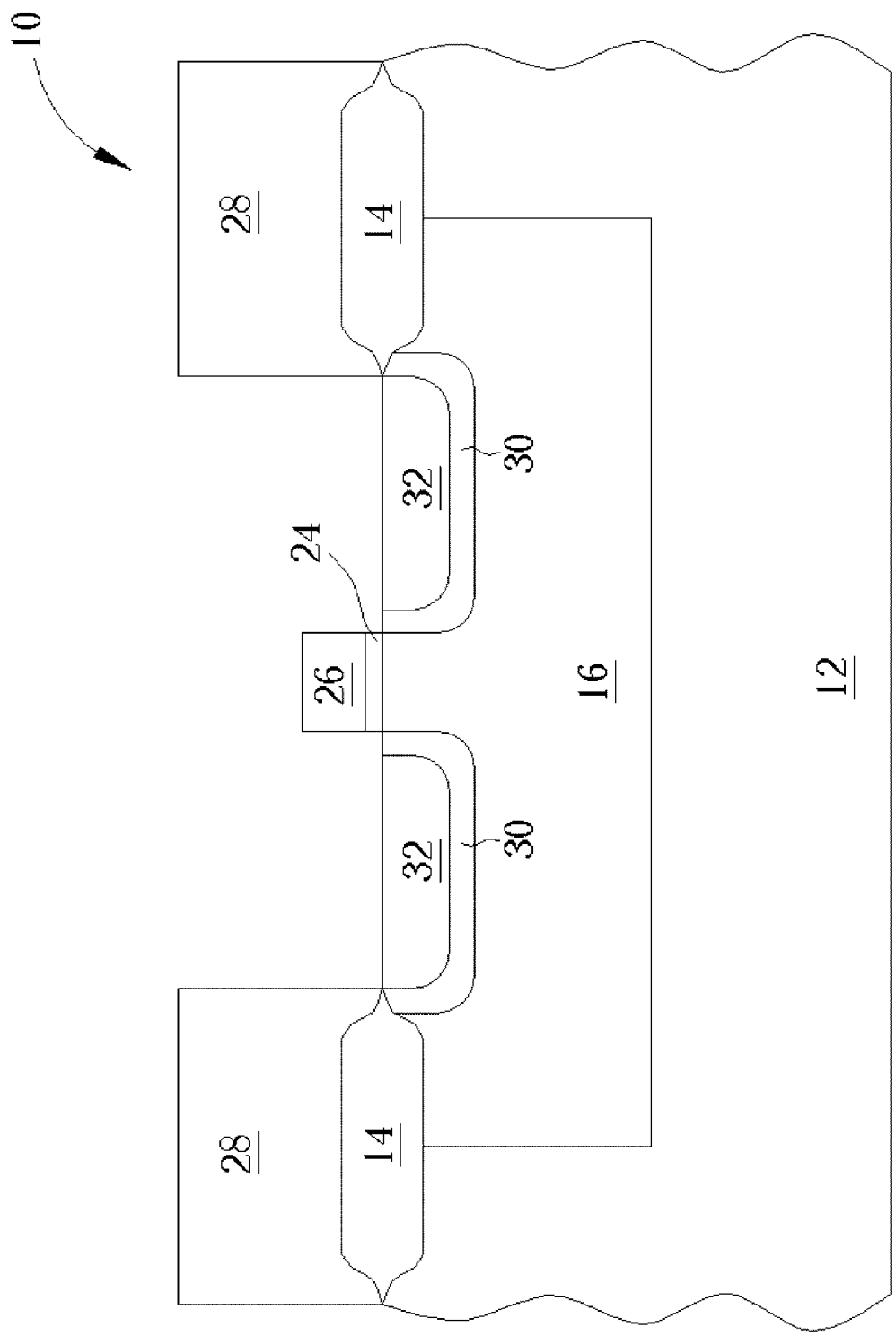
Figure 6:
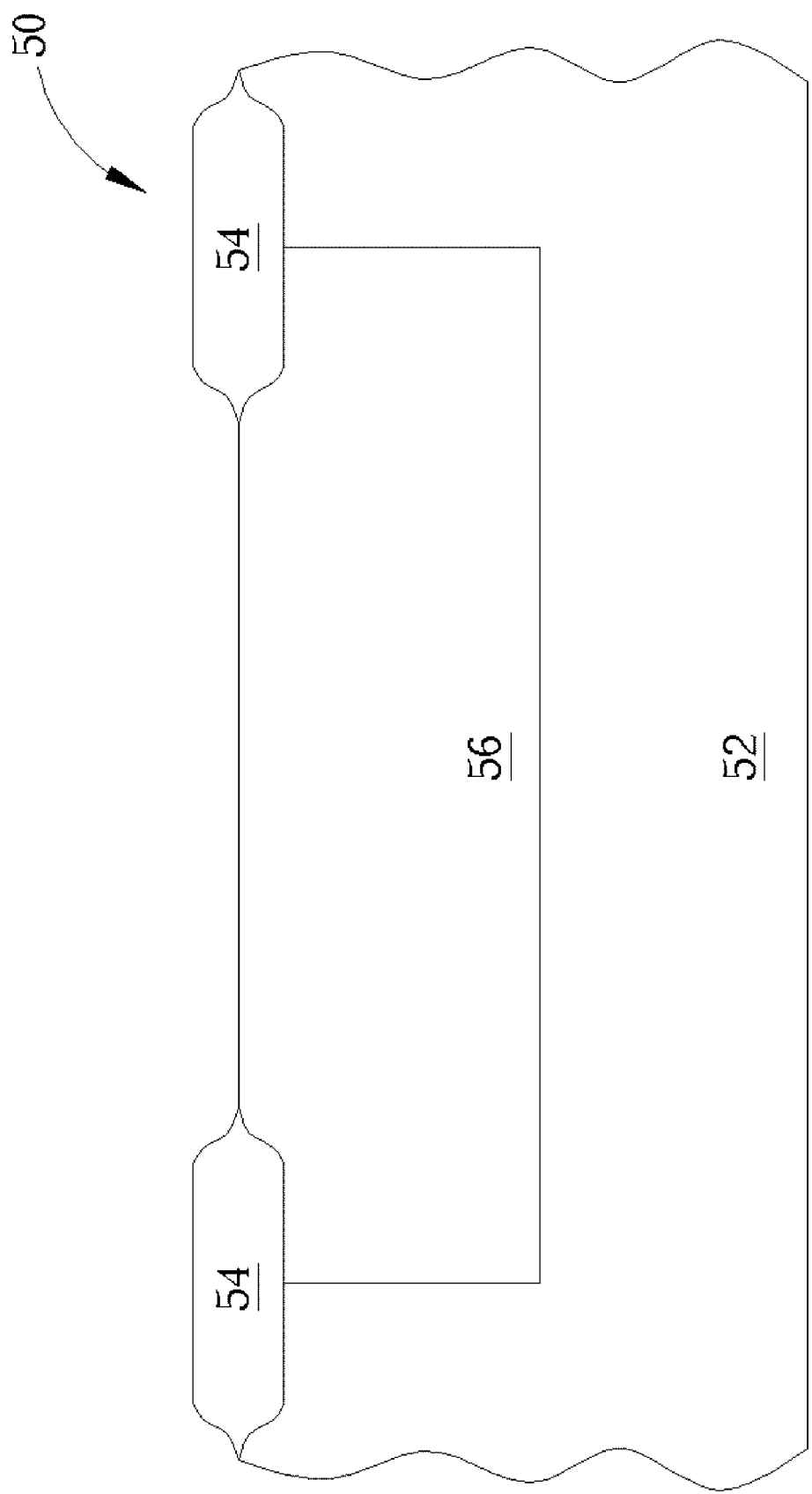
FIG. 6 to FIG. 10 are schematic diagrams illustrating a method of forming a P type HVMOS transistor according to a preferred embodiment of the present invention.

Please refer to FIG. 6 to FIG. 10. FIG. 6 to FIG. 10 are schematic diagrams illustrating a method of forming a P type HVMOS transistor 50 with DDD according to a preferred embodiment of the present invention. As shown in FIG. 6, first a substrate 52 is provided. The substrate 50 can be a polysilicon substrate, an epitaxial silicon substrate, or a silicon on insulator (SOI) substrate. Then, a thermal oxidation process is carried out to form two field oxide layers 54 in the substrate 52, and an N type well is formed in the substrate 52 by doping ions, such as phosphorous (P) or arsenic (As), into the substrate 52 between the field oxide layers 54. The field oxide layers 54 are for insulating adjacent HVMOS transistors or other components, and thus other structures such as trenches can replace the field oxide layers 54 in the present invention.

Figure 7:
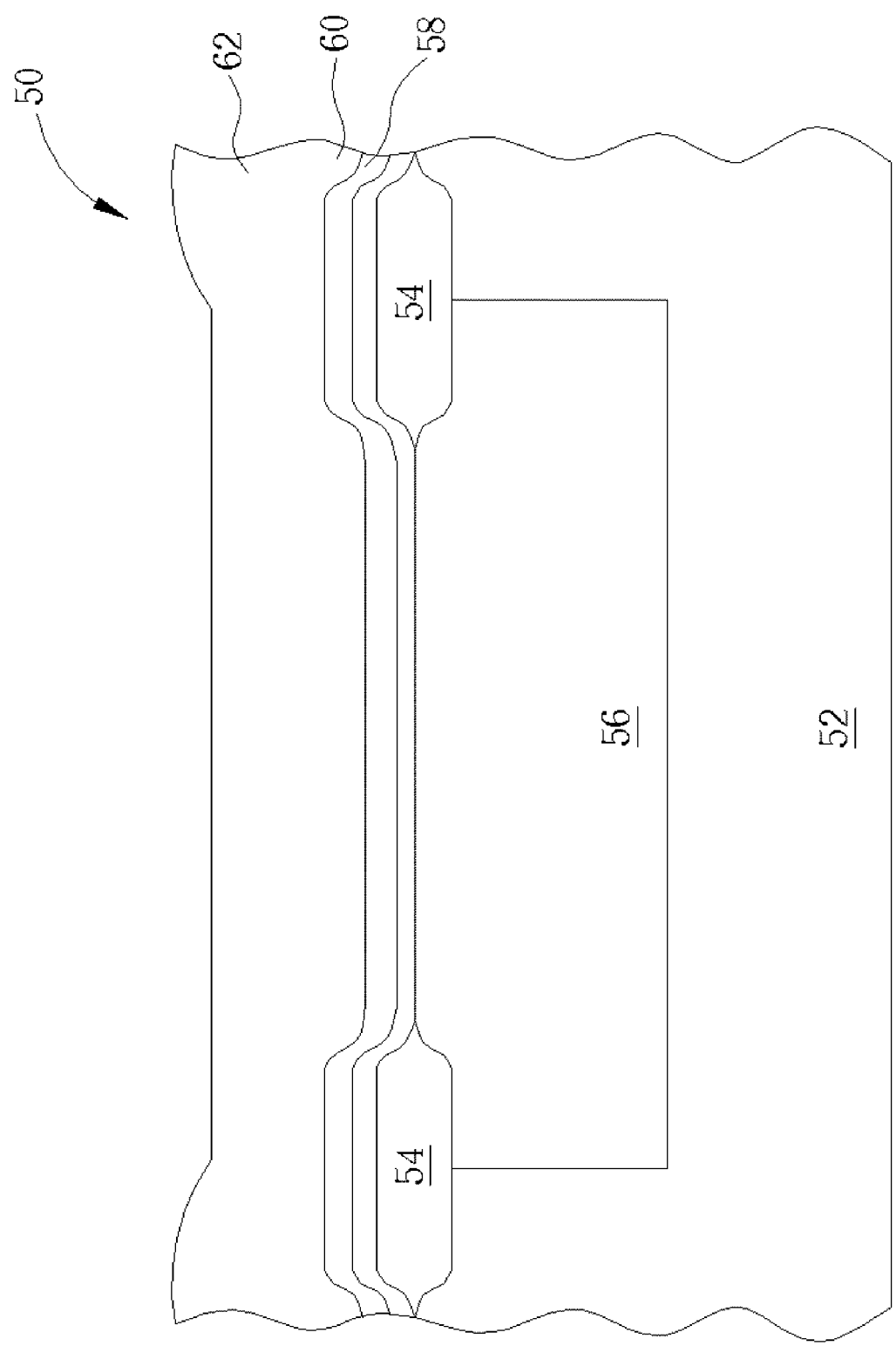

As shown in FIG. 7, a thermal oxidation process is carried out to form an oxide layer 58 on the substrate 52, and then a polysilicon layer 60 is deposited on the oxide layer 58. Thereafter, a photoresist layer 62 is coated onto the polysilicon layer 60. Since the polysilicon layer 60 is used as a gate, the polysilicon layer 60 can be doped polysilicon or undoped polysilicon. Furthermore, a silicide layer (not shown) can be formed on the polysilicon layer 60 for improving conductivity.

Figure 8:
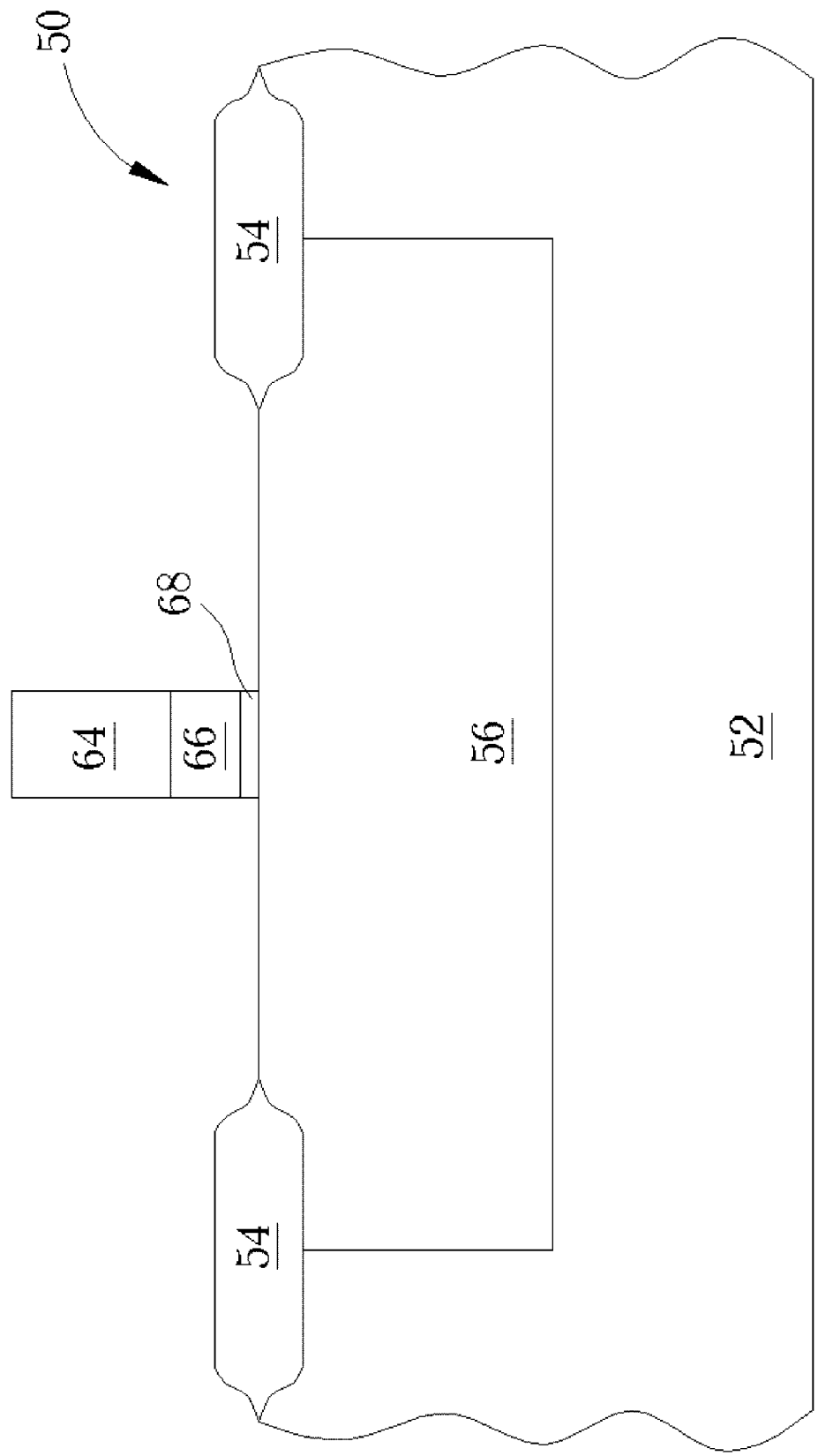

As shown in FIG. 8, an exposure process and a development process are consecutively performed to remove a portion of the photoresist layer 62 such that a first patterned photoresist layer 64 is formed on the polysilicon layer 60. Then, an etching process is carried out by utilizing the patterned photoresist layer as a hard mask to remove the polysilicon layer 60 and the oxide layer 58 not covered by the first patterned photoresist layer 64 such that a gate oxide layer 68 and a gate 66 are formed. It is worth noting that the first patterned photoresist layer 64 is not removed immediately after the gate 66 and the gate oxide layer 68 are formed. The first patterned photoresist layer 64 is retained as a hard mask for the following ion implantation processes. Therefore, the method of the present invention further comprises an ultraviolet curing process for improving adhesion of the first patterned photoresist layer 64, and enhancing the resisting ability of the first patterned photoresist layer 64 against the doped ions during the following ion implantation processes.

Figure 9:
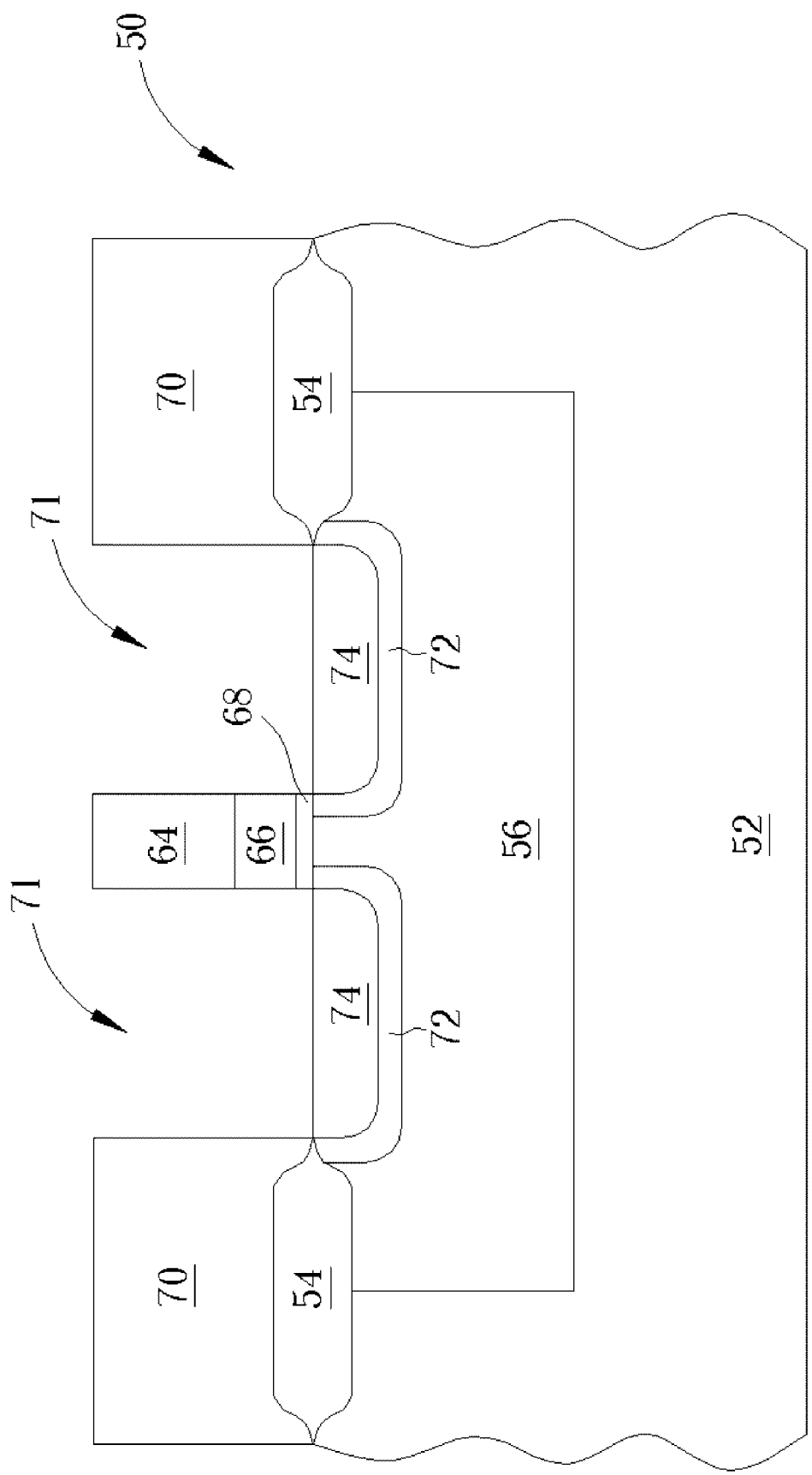

As shown in FIG. 9, another photoresist layer (not shown) is coated onto the substrate 52, and an exposure process and a development process are performed to remove a portion of the photoresist layer (not shown) such that a second patterned photoresist layer 70 is formed on the field oxide layers 54. The first patterned photoresist layer 64 and the second patterned photoresist layer 70 form two openings 71. Then, a first ion implantation process is performed by utilizing the first patterned photoresist layer 64 and the second patterned photoresist layer 70 as a mask to form two N type first doped regions 72 in the substrate 52 via the two openings 71. Thereafter, a second ion implantation process is performed to form two N type second doped regions 74 above the first doped regions 72 in the substrate 52 via the two openings 71. The doped ions of the first ion implantation process and the second ion implantation processes are $BF_2^+$ or boron (B), wherein the doped concentration of the first ion implantation process is $10^{12-13}$ atoms/cm$^3$, and the doped concentration of the second ion implantation process is 10 atoms/cm$^3$. In addition, for forming an N type HVMOS transistor, phosphorous (P) ions can be used in the first ion implantation process, while arsenic (AS) ions can be used in the second implantation process. In such case, the double diffuse drain can be formed automatically since phosphorous ions and arsenic ions have different diffusing rates.

Figure 10:
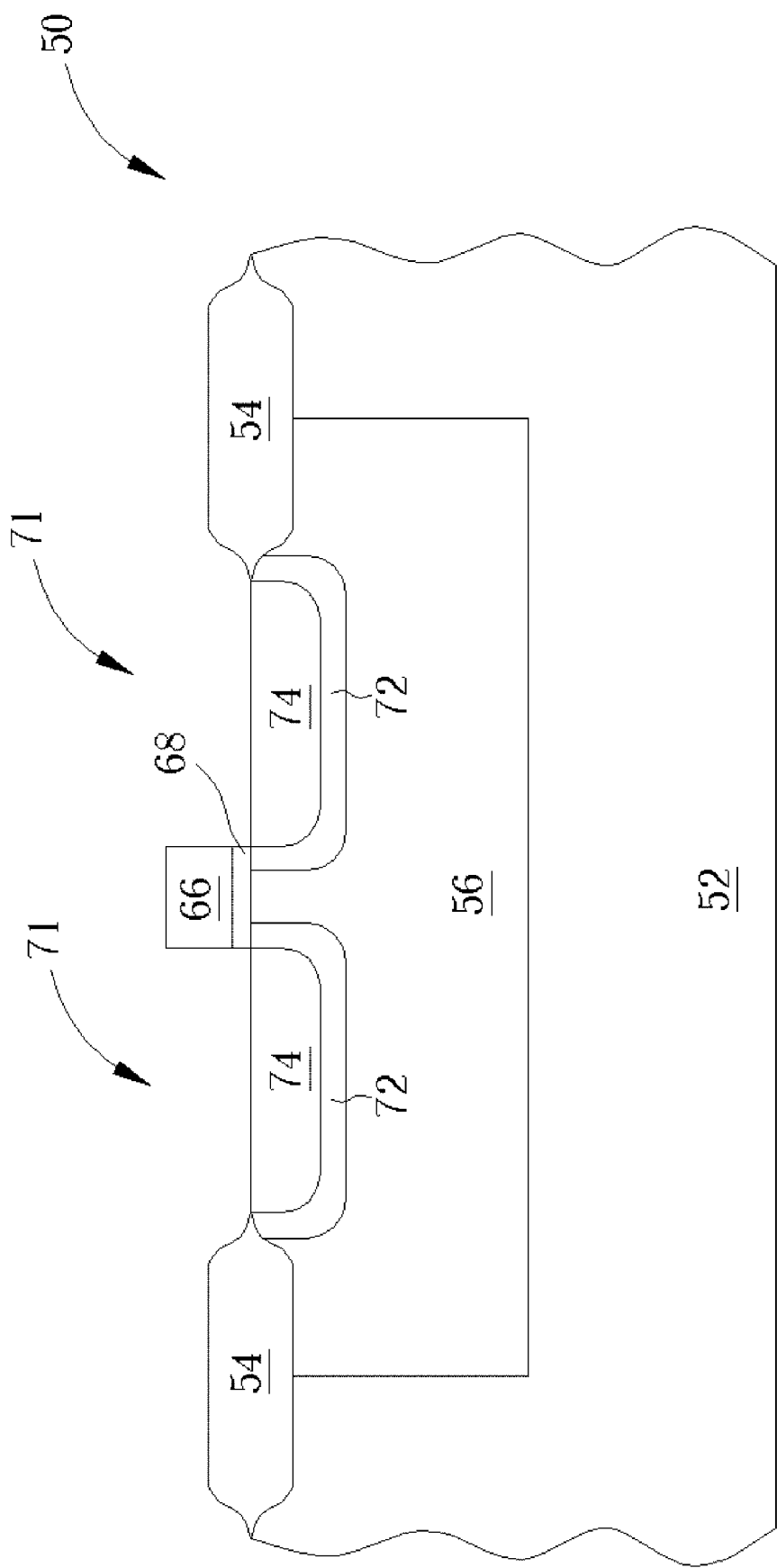

Finally, as shown in FIG. 10, the first patterned photoresist layer 64 and the second patterned photoresist layer 70 are removed.

Figure 11:
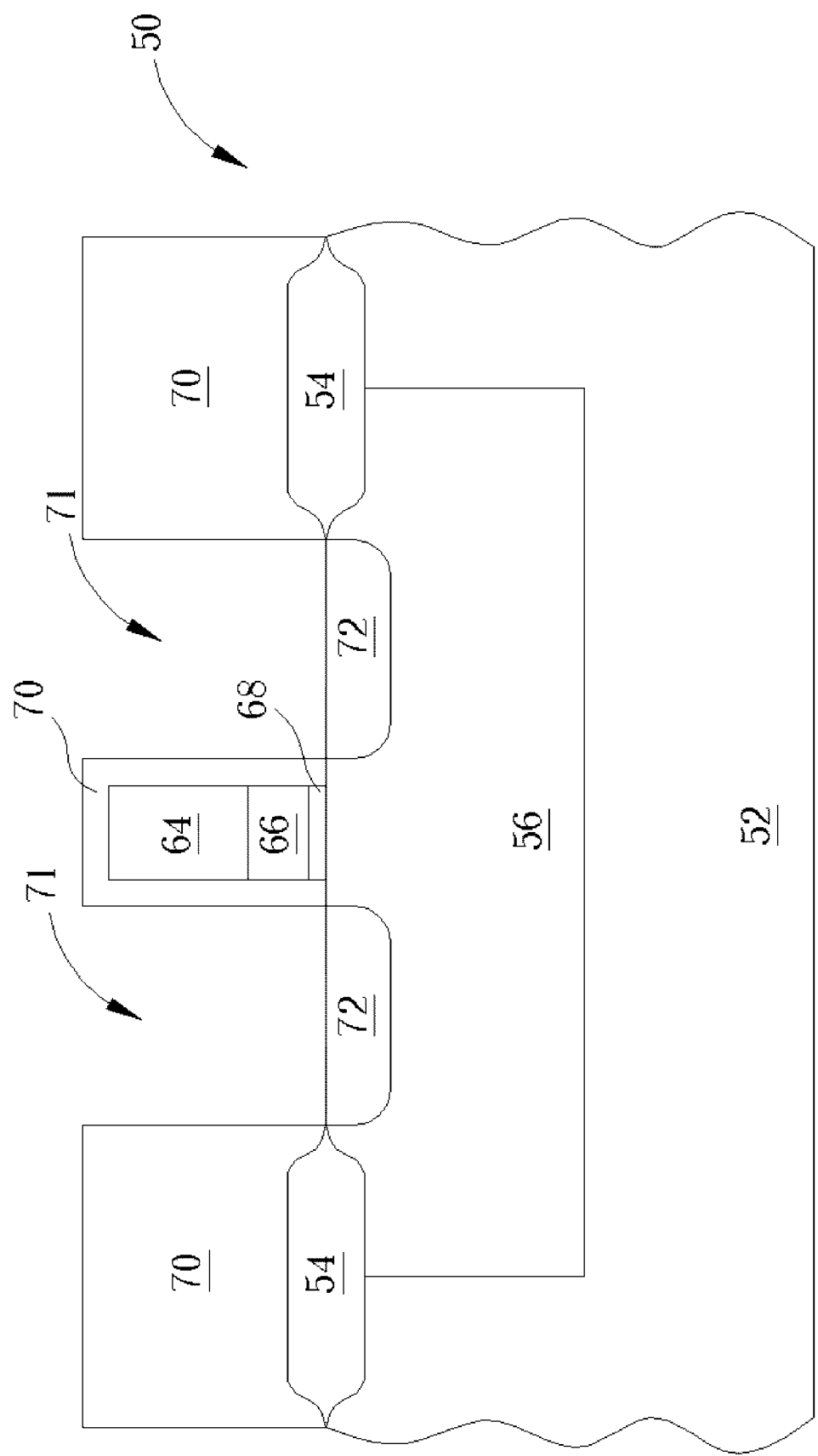
FIG. 11 to FIG. 13 are schematic diagrams illustrating a method of forming a HVMOS transistor according to another embodiment of the present invention.
Figure 12:
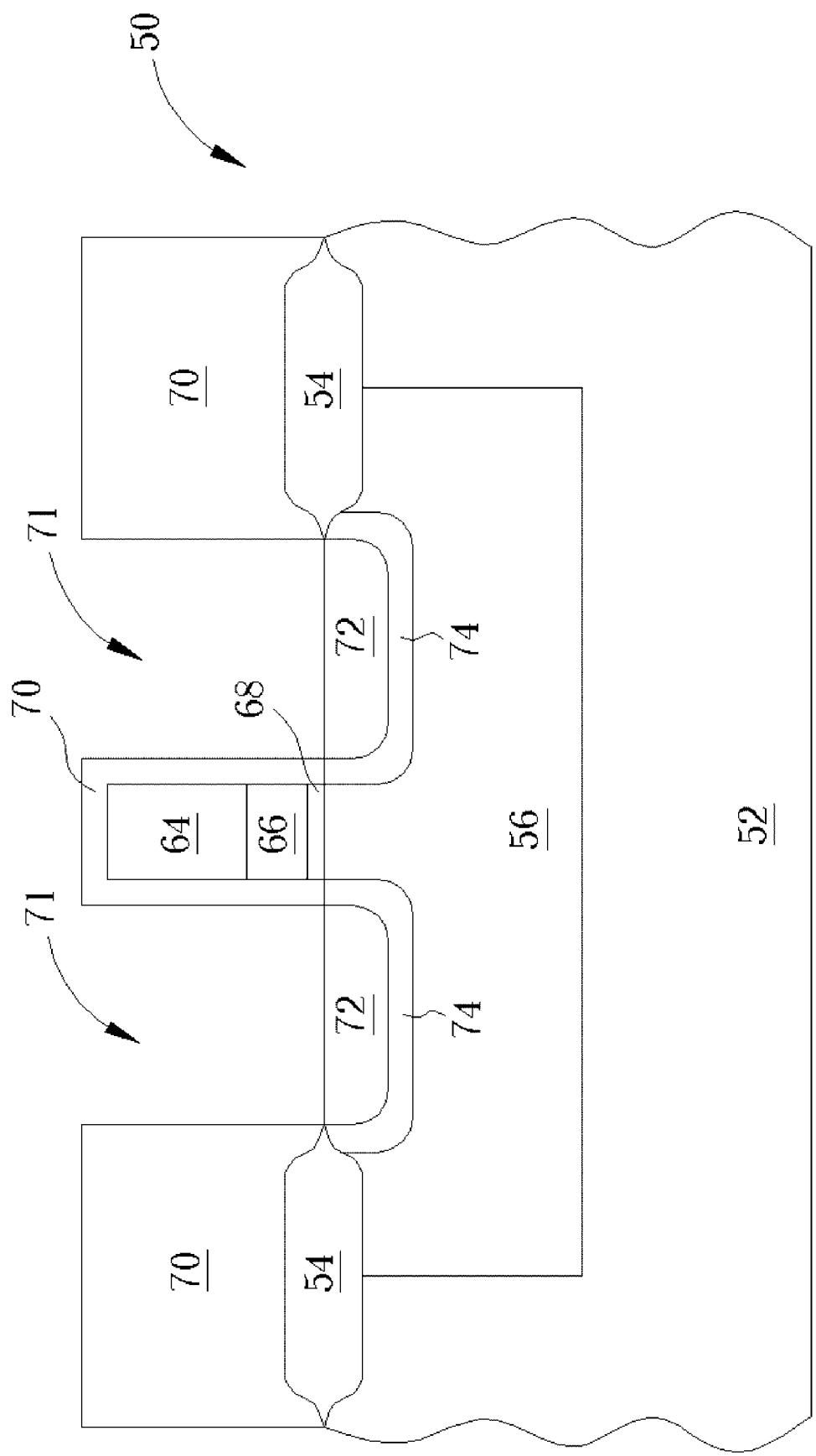
Figure 13:
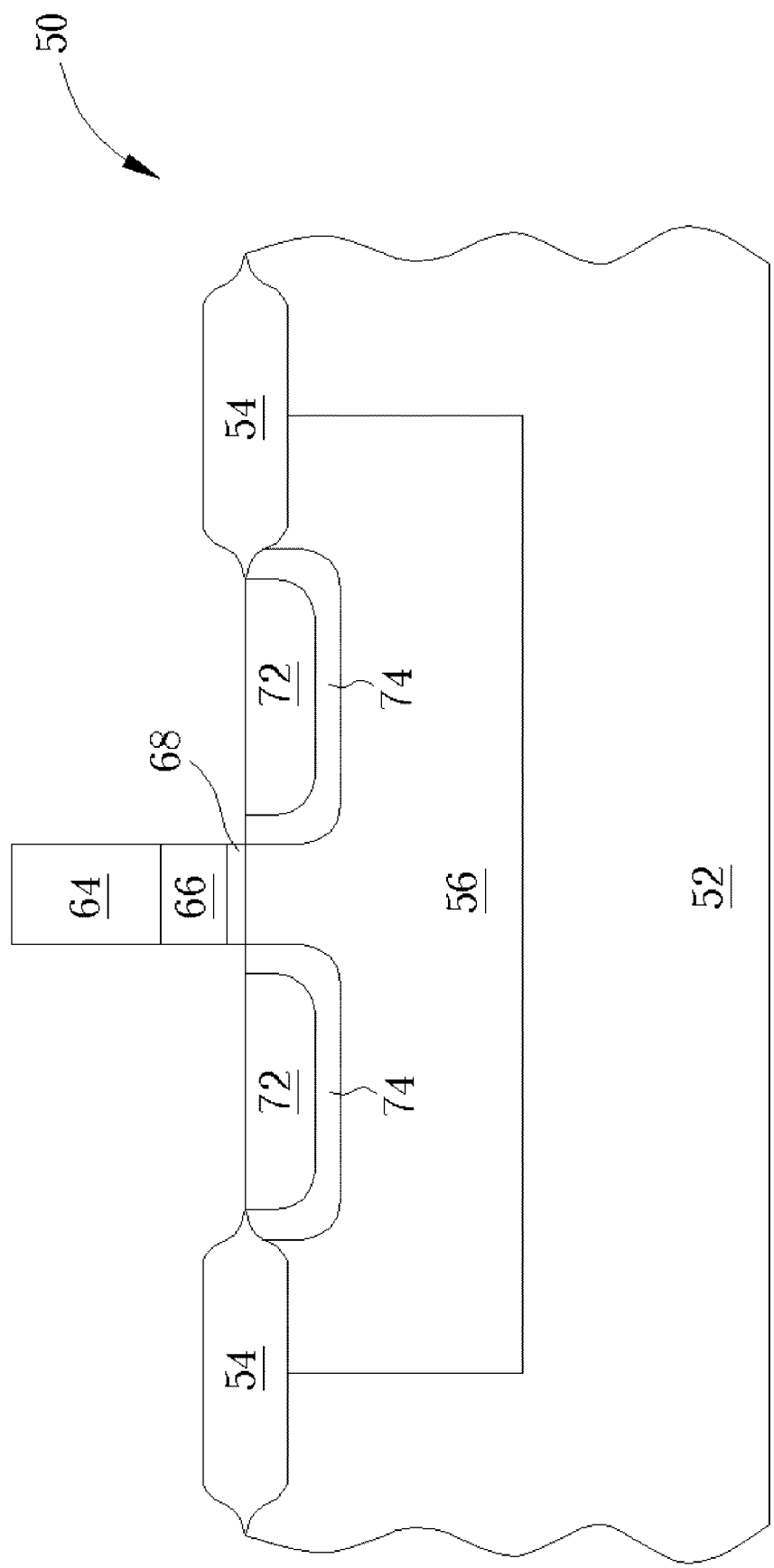

In the preferred embodiment, a method utilizing two ion implantation processes with different doping energy or different dopants for forming the double diffuse drain is disclosed. However, the present invention can also utilize following method to form the HVMOS transistor 50 having double diffuse drain. Please refer to FIG. 11 to FIG. 13. FIG. 11 to FIG. 13 are schematic diagrams illustrating a method of forming a HVMOS transistor 50 according to another embodiment of the present invention. As shown in FIG. 11, primarily, a first patterned photoresist layer 64 is formed to define a gate 66, and the first patterned photoresist layer 64 is retained. Then, a second patterned photoresist layer 70 is formed on the substrate 52 such that two openings are formed alongside the gate 66. The key difference between this embodiment and the preferred embodiment is that the second patterned photoresist layer 74 is formed on the field oxide layers 54, and around the first patterned photoresist layer 64 and the gate 66 in this embodiment. Following that, a first ion implantation process is performed by utilizing the first patterned photoresist layer 64 and the second patterned photoresist layer 70 as a hard mask to form two first doped regions 72 in the substrate 52.

As shown in FIG. 12, a descum process is performed in a chamber by injecting gases, such as $C_2F_6$, $O_2$, and He, to laterally remove a portion of the second patterned photoresist layer 70 so that the two openings 71 are enlarged. Then a second ion implantation process is performed by utilizing the first patterned photoresist layer 64 and the reduced second patterned photoresist layer 70 as a hard mask to form two second doped regions 74 in the substrate 52.

Finally as shown in FIG. 13, the first patterned photoresist layer 64 and the second patterned photoresist layer 70 are removed.

It is worth noting that the present invention can also perform two ion implantation processes accompanying a step of forming a spacer alongside the gate to produce the double diffuse drain. For example, first a first ion implantation process is performed to form two first doped regions in the substrate. Then a spacer is formed on the sidewall of the gate, and a second ion implantation process is followed to form two second doped regions smaller than the first doped regions. Since the step of forming the spacer is well known in the semiconductor industry, details are not given here. The only thing that needs to be noticed is when depositing the spacer, the temperature is so high that the first patterned photoresist lyaer cannot bear. In such case, a cap layer is formed to replace the first patterned photoresist layer for protecting the gate.

According to testing results, the HVMOS transistor of the present invention has a higher breakdown voltage. For example, the breakdown voltage of a P type HVMOS transistor formed according to the present invention is increased from 18V to 30V.

In comparison with conventional technologies, the HVMOS transistor of the present invention utilizes the patterned photoresist layer that forms the gate as a hard mask to form the double diffuse drain. Hence, the breakdown voltage is effectively improved. Furthermore, the method of the present invention has the advantage of self-alignment.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a high voltage metal oxide semiconductor (HVMOS) transistor comprising:
   providing a substrate having a first conductive type well;
   forming a polysilicon layer on the substrate;
   forming a first patterned photoresist layer on the polysilicon layer, and utilizing the first patterned photoresist layer as a hard mask to remove a portion of the polysilicon layer not covered by the first patterned photoresist layer such that a gate structure is formed;
   forming a second patterned photoresist layer onto the first patterned photoresist layer and the substrate such that two openings are formed alongside the gate;
   utilizing the first patterned photoresist layer and the second patterned photoresist layer as a hard mask to perform at least an ion implantation process for forming a second conductive type double diffuse drain via the openings; and
   removing the first patterned photoresist layer and the second patterned photoresist layer.

2. The method of claim 1 wherein the steps of forming the first patterned photoresist layer comprises:
   coating a photoresist layer on the polysilicon layer;
   performing an exposure process and a development process on the photoresist layer; and
   performing an ultraviolet curing process on the photoresist layer.

3. The method of claim 1 further comprising performing an ultraviolet curing process on the first patterned photoresist layer before the second patterned photoresist layer is formed.

4. The method of claim 1 wherein the substrate comprises two filed oxide layers.

5. The method of claim 4 wherein the steps of forming the second patterned photoresist layer comprises:
   coating a photoresist layer onto the substrate and the first patterned photoresist layer; and
   removing a portion of the photoresist layer such that the patterned photoresist layer is formed on the two field oxide layers and around the gate.

6. The method of claim 5 wherein the steps of forming the double diffuse drain is performed after forming the second patterned photoresist layer, the steps comprises:
   performing a first ion implantation process;
   performing a descum process to laterally remove a portion of the second patterned photoresist layer such that the two openings are enlarged; and
   performing a second ion implantation process.

7. The method of claim 1 wherein the ion implantation process comprises a first ion implantation process and a second ion implantation process.

8. The method of claim 7 wherein the doped concentration of the second ion implantation process is higher than the doped concentration of the first ion implantation process.

9. The method of claim 7 wherein the first ion implantation process uses same dopants as the second ion implantation process.

10. The method of claim 7 wherein the first ion implantation process uses different dopants from the second ion implantation process.

11. A method of forming a semiconductor transistor with double diffuse drain (DDD) in a substrate, the substrate comprising a first conductive type well, the method comprising:
    forming a polysilicon layer and a first photoresist layer on the substrate;
    removing a portion of the first photoresist layer and performing an ultraviolet curing process to the first photoresist layer;
    utilizing the first photoresist layer as a hard mask to remove a portion of the polysilicon layer not covered by the first photoresist layer such that a gate structure is formed;
    coating a second photoresist layer onto the substrate and the first photoresist layer, and removing the second photoresist layer above the first photoresist layer and removing a portion of the second photoresist layer alongside the gate structure such that two openings are formed;
    utilizing the first photoresist layer and the second photoresist layer as a hard mask to perform a first ion implantation process for forming two second conductive type first doped regions in the well via the openings;
    utilizing the first photoresist layer and the second photoresist layer as a hard mask to perform a second ion implantation process for forming two second conductive type second doped regions in upper portions of the two first doped regions via the openings; and
    removing the first photoresist layer and the second photoresist layer.

12. The method of claim 11 wherein the doped concentration of the second doped regions is higher than the doped concentration of the first doped regions.

13. The method of claim 11 wherein the first ion implantation process uses same dopants as the second ion implantation process.

14. The method of claim 11 wherein the first ion implantation process uses different dopants from the second ion implantation process.

* * * * *